(12) United States Patent
Rueger et al.

(10) Patent No.: US 10,191,115 B2
(45) Date of Patent: Jan. 29, 2019

(54) METHOD AND DEVICE FOR DETERMINING AN OPEN-CIRCUIT VOLTAGE PROFILE OF A VEHICLE BATTERY, DEPENDENT ON A STATE OF CHARGE

(71) Applicant: Robert Bosch GmbH, Stuttgart (DE)

(72) Inventors: Michael Rueger, Munich (DE); Andre Boehm, Kornwestheim (DE)

(73) Assignee: Robert Bosch GmbH, Stuttgart (DE)

( * ) Notice: Subject to any disclaimer, the term of this patent is extended or adjusted under 35 U.S.C. 154(b) by 405 days.

(21) Appl. No.: 15/028,882

(22) PCT Filed: Sep. 25, 2014

(86) PCT No.: PCT/EP2014/070546
§ 371 (c)(1),
(2) Date: Apr. 12, 2016

(87) PCT Pub. No.: WO2015/055400
PCT Pub. Date: Apr. 23, 2015

(65) Prior Publication Data
US 2016/0259008 A1 Sep. 8, 2016

(30) Foreign Application Priority Data

Oct. 14, 2013 (DE) ........................ 10 2013 220 688

(51) Int. Cl.
*G01R 31/36* (2006.01)
*B60L 11/18* (2006.01)

(52) U.S. Cl.
CPC ........ *G01R 31/362* (2013.01); *B60L 11/1861* (2013.01); *G01R 31/3651* (2013.01)

(58) Field of Classification Search
CPC ........................ G01R 31/362; B60L 11/1861
See application file for complete search history.

(56) References Cited

U.S. PATENT DOCUMENTS 3,392,328 A 7/1968 Figg
6,072,300 A 6/2000 Tsuji
(Continued)

FOREIGN PATENT DOCUMENTS

CN 102035024 A 4/2011
DE 2417391 10/1974
(Continued)

OTHER PUBLICATIONS

Weng et al., A Unified Open-Circuit-Voltage Model of Lithium-ion Batteries for State-of-Charge Estimation and State-of-Health Monitoring, Preprint submitted to Journal of Power Sources, Aug. 2013.*

(Continued)

*Primary Examiner* — Daniel Miller
(74) *Attorney, Agent, or Firm* — Michael Best & Friedrich LLP

(57) ABSTRACT

The present invention relates to a method and to a battery management system which are suitable for determining an open-circuit voltage profile (3) of a vehicle battery, dependent on a state of charge, in a vehicle. In this context, the following occur: complete discharging (S1) of the vehicle battery by vehicle-internal loads of the vehicle, sensing (S2) of a first sensed, state-of-charge-dependent voltage profile (1) during the discharging (S1) of the vehicle battery, complete charging (S3) of the vehicle battery by a charging device, sensing (S4) of a second sensed state-of-charge-dependent voltage profile (2) during the charging (S3) of the vehicle battery, and determination (S5) of the state-of-charge-dependent open-circuit voltage profile (3) by means of a weighted interpolation of the first sensed voltage profile (1) and of the second sensed voltage profile (2).

10 Claims, 3 Drawing Sheets

(56) References Cited

U.S. PATENT DOCUMENTS

| | | |
|---|---|---|
| 6,924,622 B1 | 8/2005 | Anbuky et al. |
| 2003/0076109 A1 | 4/2003 | Verbrugge et al. |
| 2004/0100267 A1 | 5/2004 | Koch |
| 2008/0197807 A1 | 8/2008 | Simopoulos et al. |
| 2008/0243405 A1 | 10/2008 | Iwane |
| 2009/0030626 A1 | 1/2009 | Iwane et al. |
| 2011/0215761 A1 | 9/2011 | Mingant et al. |
| 2012/0191390 A1 | 7/2012 | Kang et al. |
| 2013/0085695 A1 | 4/2013 | Ono |
| 2013/0257377 A1 | 10/2013 | Diamond et al. |

FOREIGN PATENT DOCUMENTS

| | | |
|---|---|---|
| DE | 102007029956 | 1/2009 |
| EP | 1380849 | 1/2004 |
| WO | 0062086 | 10/2000 |

OTHER PUBLICATIONS

Snihir, Battery open-circuit voltage estimation by a method of statistical analysis, Journal of Power Sources 159, 1484-1487, 2006.*
Lithium iron phosphate battery, available at https://en.wikipedia.org/wiki/Lithium_iron_phosphate_battery on May 11, 2013.*
International Search Report for Application No. PCT/EP2014/070546 dated Dec. 2, 2014 (English Translation, 3 pages).

* cited by examiner

METHOD AND DEVICE FOR DETERMINING AN OPEN-CIRCUIT VOLTAGE PROFILE OF A VEHICLE BATTERY, DEPENDENT ON A STATE OF CHARGE

BACKGROUND OF THE INVENTION

The present invention relates to a method and a device, particularly a battery management system, for determining an open-circuit voltage profile of a vehicle battery, dependent on a state of charge, in a vehicle.

Vehicle batteries for automotive applications are subject to ageing which changes the chemical and electrical properties of the vehicle battery. In this context, capacity and energy content are reduced whereas the inner resistance generally increases.

Particularly the open-circuit voltage of the vehicle battery is subject to ageing and changes the voltage profile thereof dependent on a state of charge in some vehicle batteries. This affects different algorithms which are carried out by means of a responsible battery management system. Said algorithms include, for example, determining the charging state and determining the capacity. In addition, the accuracy of said algorithms carried out by the responsible battery management system is reduced.

A measurement of the open-circuit voltage is possible by means of the GITT method (galvanostatic intermittent titration technique). To this end, a discharging and a charging of a battery are carried out with constant current. This measurement is advantageously performed when the current amplitude is as small as possible. The current amplitude can, for example, be selected according to a C-factor C20. That means that the current amplitude is selected in such a way that a discharging of a completely charged battery 20 lasts hours. As a result, the precision of the measurement increases with increasing measuring time.

SUMMARY OF THE INVENTION

The method according to the invention for determining an open-circuit voltage profile of a vehicle battery, dependent on a state of charge, in a vehicle comprises a complete discharging of the vehicle battery by vehicle-internal loads of the vehicle, a sensing of a first sensed, state-of-charge-dependent voltage profile during the discharging of the vehicle battery, a complete charging of the vehicle battery by a charging device, a sensing of a second sensed state-of-charge-dependent voltage profile during the charging of the vehicle battery, and a determination of the state-of-charge-dependent open-circuit voltage profile by means of a weighted interpolation of the first sensed voltage profile and of the second sensed voltage profile.

The battery management system according to the invention is suitable for determining an open-circuit voltage profile of a vehicle battery, dependent on a state of charge, in a vehicle. The battery management system comprises a discharge unit which is designed to completely discharge a vehicle battery by vehicle-internal loads of the vehicle, a charging unit which is designed to completely charge the vehicle battery by means of a charging device, a sensing unit which is designed to sense a first sensed, state-of-charge-dependent voltage profile during the discharging of the vehicle battery and a second sensed, state-of-charge dependent voltage profile during the charging of the vehicle battery and a determination unit which is designed to determine a state-of-charge-dependent open-circuit voltage profile by means of a weighted interpolation of the first sensed voltage profile and of the second sensed voltage profile.

The method according to the invention and the battery management system according to the invention are advantageous because no additional hardware besides the otherwise required hardware in the user operation and also no skilled personnel are necessary in order to obtain a regular determination of the state-of-charge-dependent open-circuit voltage profile of a vehicle battery. A particularly precise determination of the state-of-charge dependent open-circuit voltage profile is achieved by the weighted interpolation, whereby the results of algorithms based thereupon also lead to improved calculation results. The influences of errors, such as, e.g., on account of uneven charging and discharging current can be compensated.

A first decision parameter is preferably queried in an introductory step of the method and a decision whether said method is to be continued occurs on the basis of a comparison of the first decision parameter to a given threshold value. The first decision parameter is particularly a parameter which describes the mileage on the vehicle, a charge throughput of the vehicle battery and/or an energy throughput of the vehicle battery. In this way, the method is carried out if it is likely that a state-of-charge-dependent open-circuit voltage profile determined at an earlier point in time no longer corresponds to the actual state-of-charge-dependent open-circuit voltage profile. Constant, time consuming measurements are therefore avoided.

In a likewise preferred manner, a query of a connection status, which describes the availability of a charging voltage for charging the vehicle battery, takes place prior to the step of the method involving the complete discharging of the vehicle battery. It is thus ensured that the method can be completely carried out and a discharging of the vehicle battery only then occurs if said battery can also be charged again. A charging voltage is at least always available if the vehicle is connected to a voltage supply. Because the vehicle is connected to a voltage supply by the user, it is to be expected that the vehicle is not needed for use at this point in time.

It is advantageous if a query of a second decision parameter takes place prior to the step of the method involving the complete discharging of the vehicle battery, wherein an input of the second decision parameter is preferably facilitated by a user and wherein the method is ended or continued dependent upon the second decision parameter. It is thereby achieved that a user has the option of preventing the method from being carried out prior to discharging the vehicle battery. The situation can thus be prevented that the vehicle is in a non-operable state if usage is desired by the user.

In addition, it is advantageous if a query of a delay time occurs prior to the step in the method involving discharging the vehicle battery, wherein an input of the delay time is enabled preferably by a user and wherein the method is delayed in a step following the query of the delay time for the duration of the defined delay time, in the event said delay time is not equal to zero. In so doing, the discharging of the vehicle battery can be moved to a later point in time. The input of said delay time by the user is advantageous because the user can assess when the vehicle is not needed for use.

A query of an execution time period particularly takes place prior to the procedural step of completely discharging the vehicle battery, wherein an input of the execution time period is preferably enabled by a user and wherein a battery current which flows while discharging the vehicle battery and/or while charging said vehicle battery is selected in such a manner that the method is completed in the predefined execution time period. In the case of a short execution time period, the vehicle is again ready for use at an earlier point in time. In the case of a long execution time period, more precise values for the state-of-charge-dependent open-circuit voltage profile can be determined. The input of this execution time period by the user is advantageous because said user can assess when the vehicle is again required for use and therefore the input of a corresponding execution time period is possible.

In a preferred embodiment of the invention, a pre-charging of the vehicle battery, during which the vehicle battery is completely charged, takes place prior to the procedural step of completely discharging the vehicle battery. This has the effect that a first sensed, state-of-charge-dependent voltage profile can be determined across all charging states. The result of the determination is therefore more precise because no charging states occur for which a second sensed state-of-charge-dependent voltage profile is sensed.

It is particularly advantageous in the preferred embodiment described above if a sensing of a third sensed state-of-charge-dependent voltage profile of the vehicle battery takes place during the pre-charging of the vehicle battery. The determination of the state-of-charge-dependent open-circuit voltage profile takes place in this case by means of a weighted interpolation of the first sensed, state-of-charge-dependent voltage profile, of the second sensed, state-of-charge-dependent voltage profile and of the third sensed state-of-charge-dependent voltage profile. A more precise result of said determination is achieved on the basis of additional measurement values provided by the additionally sensed, third sensed state-of-charge-dependent voltage profile. This is particularly the case in the event only two sensed, state-of-charge-dependent voltage profiles are available in individual regions for the determination of the state-of-charge-dependent open-circuit voltage profile. In this case, said determination can also take place on the basis of the remaining sensed state-of-charge-dependent voltage profiles.

It is advantageous in all of the embodiments to maintain a temperature of the vehicle battery above a temperature threshold value during the charging and the discharging of the vehicle battery and to maintain the temperature particularly at a constant value above the temperature threshold value. This is advantageous because a distortion of the sensed, state-of-charge-dependent voltage profiles can occur as a result of temperature fluctuations. The temperature is advantageously set by means of a thermal management of the vehicle battery.

In addition, it is advantageous in all of the embodiments if a calculation of a resulting state-of-charge-dependent open-circuit voltage profile takes place by means of a weighted interpolation of the state-of-charge-dependent open-circuit voltage profile with a state-of-charge-dependent open-circuit voltage profile determined at an earlier point in time. Possible measurement errors and inaccuracies are compensated by such an interpolation in the event that said errors and inaccuracies occur only during the course of a one-time determination of a state-of-charge-dependent open-circuit voltage profile. Repeatedly occurring characteristics enter, however, increasingly into the result of the determination.

BRIEF DESCRIPTION OF THE DRAWINGS

Exemplary embodiments of the invention are described below in detail with reference to the accompanying drawings. In the drawings.

DETAILED DESCRIPTION

The method according to the invention facilitates the measurement or, respectively, the determination of a state-of-charge-dependent open-circuit voltage profile 3 of a vehicle battery. A change in this open-circuit voltage profile can also be acquired across an aging process of the vehicle battery. The method can particularly be used for determining the state-of-charge-dependent open-circuit voltage profile 3 in plug-in hybrid electric vehicles (PHEV), hybrid electric vehicles (HEV) and electric vehicles (EV). In this context, no hardware besides the already available hardware is necessary. In particular, a special shop tester is not required. The determination of a state-of-charge-dependent open-circuit voltage profile 3 basically takes place according to the GITT method.

In the method according to the invention, the determination of the state-of-charge-dependent open-circuit voltage profile 3 takes place internally within the vehicle, as precisely as possible and only with hardware available within the vehicle.

Figure 1:
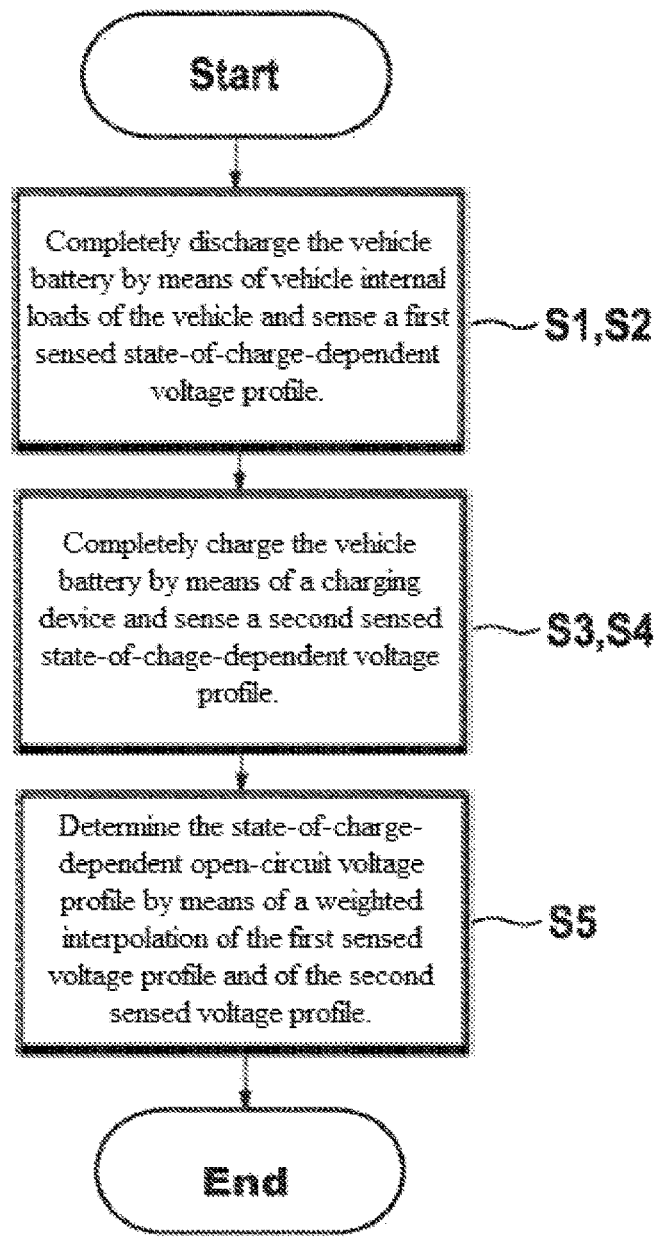
FIG. 1 shows a flow diagram of the method according to the invention in a first embodiment.

FIG. 1 shows a flow diagram of the method according to the invention in a first embodiment. The method can, for example, be started by means of a start signal of an independent vehicle system of by means of a request by a user.

In a first procedural step S1, a complete discharging of the vehicle battery occurs by means of vehicle-internal loads of the vehicle. Such components of the vehicle are designated as vehicle-internal loads, which are also available during a user operation of the vehicle. Examples of such components include, for example, a heater (if applicable compensated by the simultaneous operation of a cooling system), fans, pumps, electric machines or similar components. In this regard, those loads are to be preferred which are characterized by a constant current consumption.

When completely discharging the vehicle battery by vehicle-internal loads of the vehicle in the first procedural step S1, it is advantageous if the discharging is carried out with discharging current that is as constant as possible. An external or internal charging device is likewise a vehicle-internal load if said device has a feedback option into the electric power grid.

Figure 3:
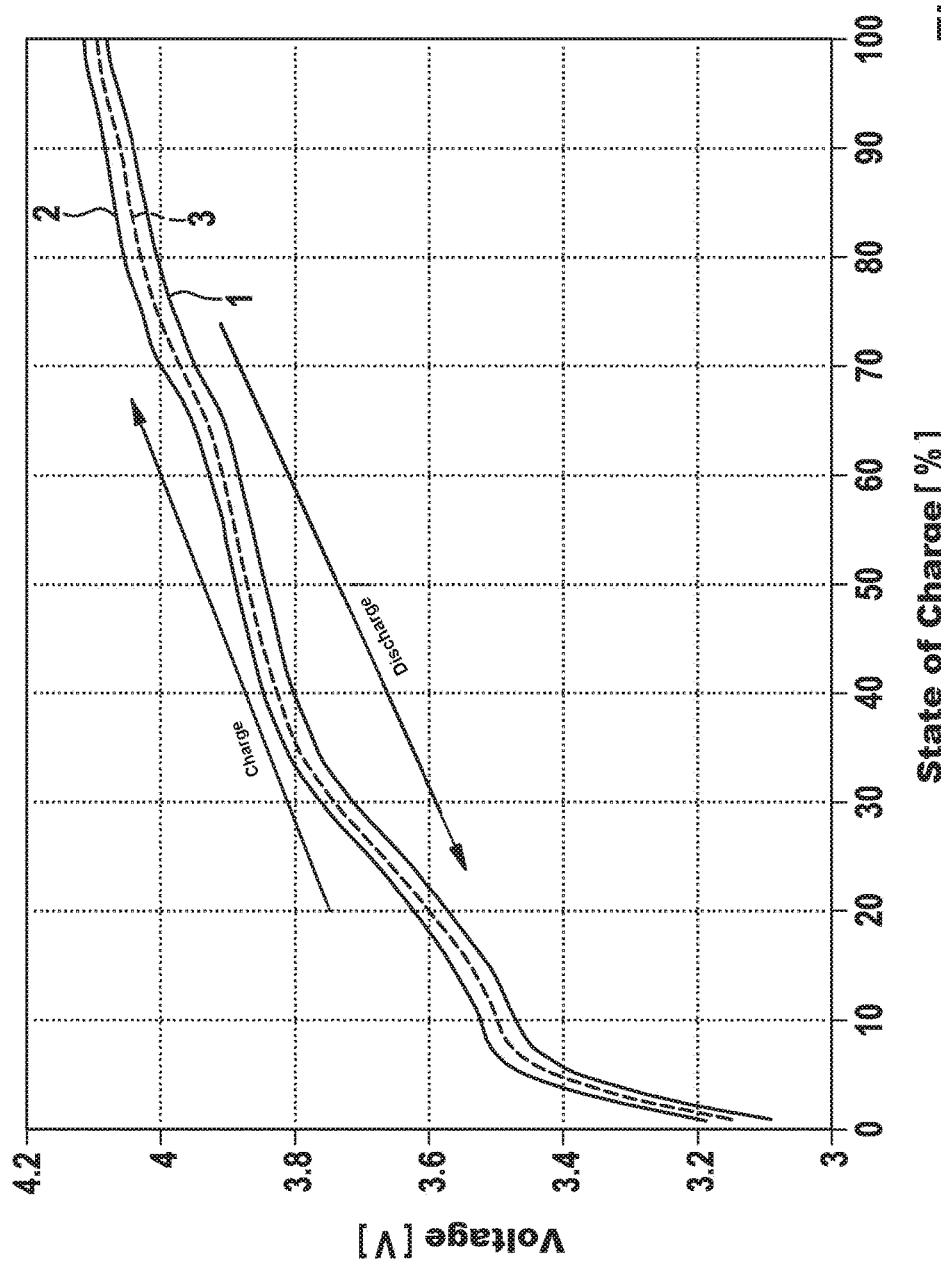
FIG. 3 shows a graphic depiction of a state-of-charge-dependent open circuit voltage profile of a first sensed, state-of-charge-dependent voltage profile and a second sensed, state-of-charge-dependent voltage profile.

During the discharging of the vehicle battery in the first procedural step S1, a sensing of a first sensed, state-of-charge-dependent voltage profile 1 takes place within the scope of a simultaneously executed second procedural step S2. This sensing can, for example, take place by a means of a simultaneously clocked measuring of voltage values at the poles of the vehicle battery. Each voltage value acquired in the process is associated with a charging state of the vehicle battery. The charging state could, for example, be described by means of the time which elapses between the measurement of a voltage value and a complete discharging of the vehicle battery. Such a first sensed, state-of-charge-dependent voltage profile 1 is shown in FIG. 3.

In a third procedural step S3, a complete charging of the vehicle battery occurs by means of a charging device. This charging is carried out with a charging current that is as constant as possible and as low as possible. The charging can be performed by an externally or internally connected charging device. A charging by means of a vehicle-internal generator is also possible, which is, for example, driven via a combustion engine or another energy source. A charging by means of a second vehicle battery comprising an interconnected DC/DC converter is also possible.

The discharging current occurring in the first procedural step S1 and the charging current occurring in the third procedural step S3 preferably have the same current amplitude.

Figure 2:
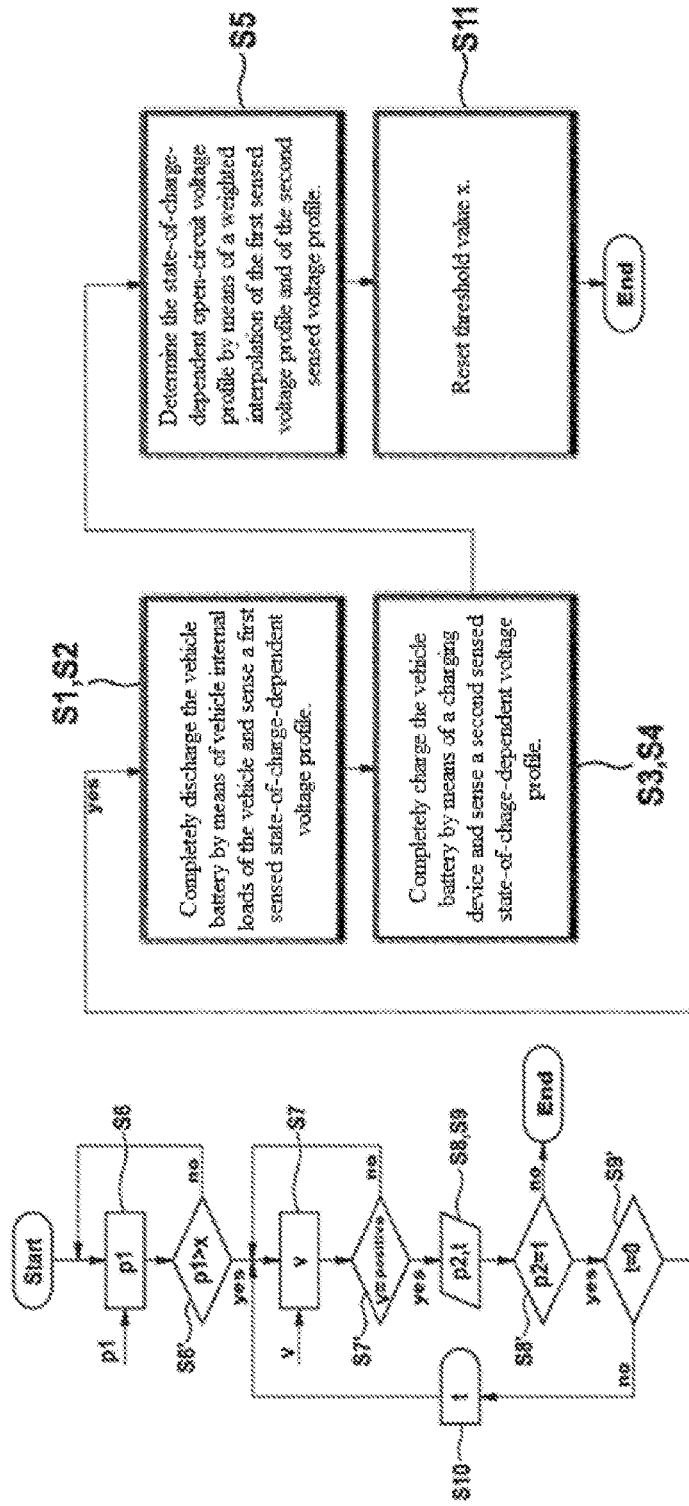
FIG. 2 shows a flow diagram of the method according to the invention in a second embodiment.

During the charging of the vehicle battery in the third procedural step S3, a sensing of a second sensed, state-of-charge-dependent voltage profile 2 occurs within the scope of a simultaneously executed fourth procedural step S4. This sensing can, for example, take place by means of a simultaneously clocked measuring of voltage values at the poles of the vehicle battery. Each voltage value acquired in the process is associated with a charging state of the vehicle battery. The charging state could, for example, be described by the time, which elapses between the measurement of a voltage value and a complete charging of the vehicle battery. Such a second sensed, state-of-charge-dependent voltage profile 2 is shown in FIG. 2.

It is advantageous, if a rest period with zero current is carried out after the end of the discharging in the first procedural step S1 and/or the end of the charging in the third procedural step S3 in order to increase the precision of the measurements. A rest period between one and five hours is advantageous because this enables the vehicle battery to cool down.

In a fifth procedural step S5, a determination of the state-of-charge-dependent open-circuit voltage profile 3 takes place by means of a weighted interpolation of the first sensed voltage profile 1 and of the second sensed voltage profile 2. To this end, a mean value is formed from each voltage value sensed in the second procedural step S2 and from the voltage value sensed in the fourth procedural step for the same state of charge. This mean value formation can be weighted if the impedance of the battery is different in the charging and discharging direction. A weighting means that either the voltage values sensed in the second procedural step S2 or the voltage values sensed in the fourth procedural step are weighted with a factor during the formation of the mean value. A compensation of the state-of-charge dependency of charging and discharging impedance can also advantageously take place, in particular if the dependency is different in the charging and discharging direction. In addition, a weighting is advantageous if the same current amplitude cannot be implemented for the charging and discharging of the vehicle battery. In this case, it is particularly advantageous to select a weighting in relation to the current amplitudes of the charging current and the discharging current. If need be, this weighting can be corrected in accordance with a different impedance in the charging and the discharging direction. The state-of-charge-dependent open-circuit voltage profile 3 ensues from the mean values which have been formed. A state-of-charge-dependent open-circuit voltage profile 3 determined by means of mean value formation is depicted in FIG. 3.

A voltage value cannot be acquired for each possible state of charge as a function of the state of charge which the vehicle battery has at a point in time, at which the first procedural step S1 is carried out and the vehicle battery is therefore discharged. Hence, the first sensed, state-of-charge-dependent voltage profile 1 does not always cover all possible charging states of the vehicle battery. It is therefore advantageous to carry out the first and the second procedural step S1, S2 if the vehicle battery has a high state of charge. In the event that the first sensed, state-of-charge-dependent voltage profile 1 does not cover all of the possible charging states of the vehicle battery, an assessment or, respectively, an extrapolation of the voltage values that are not available can be performed. As a result, the precision of the result of the determination of the state-of-charge-dependent open-circuit voltage profile 3 is reduced; however, the expenditure of time is reduced.

In an alternative embodiment of the invention, a pre-charging of the vehicle battery takes place prior to the complete discharging of the vehicle battery in the first procedural step S1. In so doing, the vehicle battery is initially completely charged. This procedural step is then particularly advantageous if the vehicle battery has a low charging state before the beginning of the first procedural step S1. The pre-charging is carried out either prior to the first procedural step S1 of the complete discharging of the battery or is only then carried out if the charging state of the vehicle battery lies below a given value. In such an embodiment, a high degree of precision in determining the state-of-charge-dependent open-circuit voltage profile 3 is achieved because the voltage values of the first sensed state-of-charge-dependent voltage profile 1 are acquired for each charging state of the battery.

In one such alternative embodiment, it is furthermore advantageous if a third sensed, state-of-charge-dependent voltage profile is sensed during the pre-charging of the vehicle battery. Thus, further measured voltage values are available for a still more precise determination of the state-of-charge-dependent open-circuit voltage profile 3. The determination of the state-of-charge-dependent open-circuit voltage profile 3 takes place in this case by means of a weighted interpolation of the first sensed, state-of-charge-dependent voltage profile 1, of the second sensed, state-of-charge-dependent voltage profile 2 and of the third sensed, state-of-charge-dependent voltage profile.

FIG. 2 shows a flow diagram of the method according to the invention in a second embodiment. The method is carried out by means of a battery management system of a vehicle. In order to determine a state-of-charge-dependent open-circuit voltage profile 3 of a vehicle battery, the first to fifth procedural steps described in the first embodiment are used. That means that the following processes occur: the complete discharging of the vehicle battery, the sensing of the first sensed, state-of-charge-dependent voltage profile, the complete charging of the vehicle battery, the sensing of the second sensed, state-of-charge-dependent voltage profile and the determination of the state-of-charge-dependent open-circuit voltage profile. If need be, the pre-charging of the vehicle battery and particularly the determination of the third state-of-charge-dependent voltage profile can furthermore take place prior to the first procedural step. The method is initiated by the user starting up the vehicle.

In this second embodiment, a first decision parameter p1 is however queried in an introductory procedural step S6. The first decision parameter p1 can be provided by other systems located in the vehicle or by the battery management system itself. Examples for the first decision parameter p1 are a current datum, the mileage on the vehicle, a charge throughput of the vehicle battery or an energy throughput of the vehicle battery. The queried first decision parameter p1 is compared to a predefined threshold value x in procedural step S6'. This threshold value x can be predefined in the battery management system during the course of a manufacturer or user configuration. If the obtained decision parameter p1 is greater than the threshold value x, the method is then continued. If the obtained decision parameter p1 is smaller than the threshold value x, the method then branches back to the introductory procedural step S6, wherein said step S6 is again carried out.

In the second embodiment described here, the first decision parameter p1 would be the mileage on the vehicle. The threshold value x is predefined by the manufacturer of the battery management system at a value of 5,000 km. At the beginning of the method, the mileage on the vehicle is therefore queried from an odometer of the vehicle. The decision parameter p1 obtained in this manner is compared to the threshold value x=5,000 km in a following comparative procedural step S6'. If the obtained decision parameter p1 is greater than the threshold value x, i.e. p1>x (=5,000 km), the method is continued. If the obtained decision parameter p1 is less than the threshold value x, i.e. p1≤x (=5,000 km), the method branches back to the introductory procedural step S6, wherein said step S6 is again carried out. A determination of the state-of-charge-dependent open-circuit voltage profile takes place after a mileage on the vehicle of 5,000 km in this example has been recorded.

It is likewise possible to predefine a plurality of threshold values and thus to define intervals. In the embodiment depicted in FIG. 2, the threshold value x is reset for this purpose in a subsequent procedural step S11, which occurs after the determination of the state-of-charge-dependent open-circuit voltage profile in the fifth procedural step S5. To this end, a given value can, for example, be added to the present threshold value.

Because the ageing of the vehicle battery is a relatively slow process, a determination of the state-of-charge-dependent open-circuit voltage profile 3 is necessary in larger intervals. The need for the determination can, for example, occur after a certain time (e.g. every 3 months), after a certain mileage (e.g. every 5,000 km), after a certain charge throughput (e.g. every 2 MAh) or after a certain energy throughput (e.g. every 1 MWh).

As previously described, the method is continued if the obtained decision parameter p1 is greater than the threshold value x. In this case, a query of a connection status v occurs after the comparative step S6' in a querying procedural step S7. The connection status v describes the availability of a charging voltage for charging the vehicle battery. If a charging voltage is available, the connection status v is thus positive. If no charging voltage is available, the connection status is thus negative. The connection status v could, for example, be sensed by sensors which detect a voltage at contacts that are used to connect a charging cable to the vehicle. If the charging voltage detected at the contacts exceeds a given threshold value, the connection status v is thus positive. Such sensors can, e.g., be provided by charging electronics. In a further comparative procedural step S7', an evaluation takes place as to whether the connection status v is positive or negative. If the queried connection status v is positive, the method is then continued. If the queried connection status is negative, the method branches back to the querying procedural step S7, by means of which the query of the connection status is carried out again.

Because the discharging and charging of the vehicle battery can last several hours in the first and the third procedural step S1, S3, a user should have the option of delaying the discharging of the vehicle battery in the first procedural step S1 and the charging of said vehicle battery in the third procedural step S3 if the vehicle will soon be needed for use. For that reason, a query of a second decision parameter p2 occurs in a following procedural step S8, which is carried out after the further comparative step S7', in the event the connection status queried in the querying procedural step S7 is positive. The decision parameter p2 is preferably defined by an input of a user. A message could thus, for example, be generated on a display in the interior of the vehicle which queries a consent of the user for a further execution of the method. The second decision parameter p2 is set as a function of an input of the user. The second decision parameter p2 is thus set to "1" if the user desires a determination of the state-of-charge-dependent open-circuit voltage profile; and the second decision parameter is set to "0" if the user does not desire this determination at this point in time because the vehicle is, for example, again needed for use in a short period of time. The method is ended or continued as a function of the second decision parameter p2. Because a complete execution of the method, in particular the discharging and the charging of the vehicle battery, in the first and the third procedural step S1, S3 requires a period of time that is considerable for the user, the user is therefore given the option of aborting the method. As a result, it is ensured that the vehicle is in an operationally ready state if this is desired by the user. In a first testing procedural step S8', a check is made whether the queried second decision parameter p2 is equal to "1". If this is not the case (if the second decision parameter p2 was set to "0"), the method is thus ended. The determination of a state-of-charge-dependent open-circuit voltage profile can in this case only be achieved if the method has been reinitiated. If the queried second decision parameter p2 is equal to "1", the method is thus continued.

In a further succeeding procedural step S9, which in this embodiment is combined with the following procedural step S8, in which the query of the second decision parameter p2 takes place, a query of a delay time t takes place. The delay time t is defined by an input by the user. A message could thus, for example, be generated on the display in the interior of the vehicle, which requests the user to define a period of time, which upon elapsing the first procedural step S1 is carried out at the earliest point in time, in the event that an immediate execution of said first procedural step S1 is not desired. In a second testing procedural step S9', a check is made whether the delay time t has been selected equal to "0". If a delay time t not equal to "0" is selected by the user, the method is then delayed for the duration of this delay time t in a delay step S10. Subsequent to this delay, the method is taken up again at the point of the querying procedural step S7. This is advantageous because the vehicle possibly is no longer supplied with a charging voltage upon the delay time t elapsing. If a delay time t equal to "0", i.e. no delay, is selected, the first procedural step, i.e. discharging of the vehicle battery, is thus immediately executed. During the further course of the method, said method is, in this case, carried out with all of the steps according to the first embodiment. Before the termination of the method, the concluding procedural step S11 previously described is carried out.

In a further alternative embodiment, which can be combined with the already described embodiments, an inquiry of an execution time period takes place prior to the complete discharging of the vehicle battery in the first procedural step S1. The execution time period is preferably defined by means of an input of a user. A message could thus, for example, be generated on a display in the interior of the vehicle, which offers the user a plurality of execution time periods for selection. A selection between a fast measurement (e.g. 8 hours execution time), a standard measurement (e.g. 24 hours execution time) and a precision measurement (e.g. 48 hours execution time) could thus be predefined. In so doing, the execution time periods can be freely selected or adapted to the physical properties of the vehicle battery. In addition, the charging state of the vehicle battery plays a role at a point in time of the selection. The execution time periods can therefore be variable and correspondingly adapted to the current charging state of the vehicle battery in order to be offered for selection.

The discharging current and the charging current are adapted below in such a way that the method is completed within the execution time period preferably selected by the user. As a result, a lower discharging current and/or charging current is selected for a long execution time period (e.g. 48 hours) than for a short execution time period (e.g. 8 hours). Because a smaller charging and/or discharging current flows in the case of a long execution time period, the battery is heated up less and the first sensed, state-of-charge-dependent voltage profile 1 and the second sensed, state-of-charge-dependent voltage profile 2 are less distorted by thermal influences. The precision increases during the determination of the state-of-charge-dependent open-circuit voltage profile 3.

Because the results during a very low execution time period (e.g. 8 h in the case of the fast measurement previously described) are comparatively imprecise, the result in this case cannot be directly used in each case. A weighting with the state-of-charge-dependent open-circuit voltage profile that is current at this point in time is therefore advantageous.

For that reason, the method according to the invention comprises a calculation step, in which a resulting state-of-charge-dependent open-circuit voltage profile occurs by means of a weighted interpolation of the state-of-charge-dependent open-circuit voltage profile 3 with a state-of-charge-dependent open-circuit voltage profile determined at an earlier point in time. To this end, a mean value comprising a voltage value of a state-of-charge-dependent open-circuit voltage profile, which was determined earlier for a corresponding charging state, is formed for each voltage value of a state-of-charge-dependent open-circuit voltage profile 3. A weighted interpolation means that the voltage value of the state-of-charge-dependent open circuit voltage profile determined at an earlier point in time enters a plurality of times into the formation of the mean value. The state-of-charge-dependent open circuit voltage profile determined at an earlier point in time could therefore be weighted, for example, twice as much with respect to the current state-of-charge-dependent open circuit voltage profile 3. The resulting state-of-charge-dependent open circuit voltage profile is described by the mean values determined in this way. Possibly occurring measurement errors (provided they are not systematic) can additionally be reduced by means of such an interpolation. Such an interpolation can, however, make necessary a more frequent execution of the determination of the state-of-charge-dependent open circuit voltage profile.

In addition, it is advantageous to reduce the size of an interval up to a redetermination of the state-of-charge-dependent open circuit voltage profile 3 in the case of a small execution time period.

In a further alternative embodiment, which can be combined with the embodiments already described, a temperature of the vehicle battery is maintained above a temperature threshold value during the charging and the discharging of the vehicle battery. This can be implemented by means of a controlled cooling and/or heating device. In a likewise advantageous manner, the temperature of the vehicle battery can be set by means of the thermal management of the vehicle battery. The sensing of the sensed, state-of-charge-dependent voltage profiles 1, 2 occurs in this embodiment at room temperature or higher because the influence or, respectively, the error due to the impedance of the battery is thereby reduced. The temperature of the vehicle battery is held constant as much as possible by means of the given means.

In all of the embodiments, a currently determined state-of-charge-dependent open-circuit voltage profile 3 can replace a state-of-charge-dependent open-circuit voltage profile determined earlier. The same is true for a resulting state-of-charge-dependent open-circuit voltage profile.

Besides the above written disclosure, reference is explicitly made to the disclosure of the FIGS. 1 to 3.

The invention claimed is:

1. A method for determining an open-circuit voltage profile of a vehicle battery, dependent on a state of charge, in a vehicle, the method comprising:
   completely discharging the vehicle battery by vehicle-internal loads of the vehicle,
   sensing a first sensed, state-of-charge-dependent voltage profile during the discharging of the vehicle battery,
   completely charging of the vehicle battery by a charging device,
   sensing a second sensed, state-of-charge-dependent voltage profile during the charging of the vehicle battery and
   determining the state-of-charge-dependent open-circuit voltage profile by means of a weighted interpolation of the first sensed voltage profile and the second sensed voltage profile.

2. The method according to claim 1, wherein a first decision parameter is queried in an introductory procedural step and a decision ensues on the basis of a comparison of the first decision parameter to a given threshold value as to whether the method is continued, wherein the first decision parameter is a parameter selected from the group consisting of a parameter that describes a period of time, a parameter that described the mileage on the vehicle, a parameter that describes a charging throughput of the vehicle battery, a parameter that describes an energy throughput of the vehicle battery.

3. The method according to claim 1, wherein a query of a connection status takes place, which describes the availability of a charging voltage for charging the vehicle battery, prior to the procedural step of completely discharging the vehicle battery, and the method is only continued if a charging voltage is available.

4. The method according to claim 1, wherein a query of a second decision parameter takes place prior to the procedural step of completely discharging the vehicle battery.

5. The method according to claim 1, wherein a query of a delay time takes place prior to the procedural step of completely discharging the vehicle battery, and wherein the method, in a step following the query of the delay time, is delayed for the duration of the defined delay time in the event of the delay time not being equal to zero.

6. The method according to claim 1, wherein a query of an execution time period takes place prior to the procedural step of completely discharging the vehicle battery, and wherein a battery current which flows during the discharging of the vehicle battery and/or the charging of the vehicle battery is selected in such a way that the method is completed in the predefined execution time period.

7. The method according to claim 1, wherein a pre-charging of the vehicle battery, in which said vehicle battery is completely charged, occurs prior to the procedural step of completely discharging the vehicle battery, wherein:

a sensing of a third sensed, state-of-charge-dependent voltage profile occurs during the pre-charging of the vehicle battery, and the determination of the state-of-charge-dependent open-circuit voltage profile takes place by means of a weighted interpolation of the first sensed, state-of-charge-dependent voltage profile, of the second sensed, state-of-charge-dependent voltage profile and of the third sensed, state-of-charge-dependent voltage profile.

8. The method according to claim 1, wherein a temperature of the vehicle battery is maintained above a temperature threshold value during the charging and the discharging of the vehicle battery, and in that the temperature is maintained at a constant value above the temperature threshold value.

9. The method according to claim 1, wherein the method furthermore comprises a calculation step, in which a calculation of a resulting state-of-charge-dependent open-circuit voltage profile takes place by means of a weighted interpolation of the state-of-charge-dependent open-circuit voltage profile with a state-of-charge-dependent open-circuit voltage profile determined at an earlier point in time.

10. A battery management system, suitable for determining a state-of-charge-dependent open-circuit voltage profile of a vehicle battery in a vehicle, comprising:

a discharging unit which is designed to completely discharge a vehicle battery by vehicle-internal consumers of the vehicle, a charging unit which is designed to completely charge the vehicle battery by means of a charging device, a sensing unit which is designed to sense a first sensed, state-of-charge-dependent voltage profile during the discharging of the vehicle battery and a second sensed, state-of-charge-dependent voltage profile during the charging of the vehicle battery, and a determination unit which is designed to determine the state-of-charge-dependent open-circuit voltage profile by means of a weighted interpolation of the first sensed voltage profile and of the second sensed voltage profile.

* * * * *